(12) United States Patent
Verhulst et al.

(10) Patent No.: US 9,608,094 B2
(45) Date of Patent: Mar. 28, 2017

(54) HETEROSECTION TUNNEL FIELD-EFFECT TRANSISTOR (TFET)

(71) Applicant: IMEC VZW, Leuven (BE)

(72) Inventors: Anne S. Verhulst, Houtvenne (BE); Geoffrey Pourtois, Villers-la-Ville (BE); Rita Rooyackers, Kessel-lo (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 14/841,566

(22) Filed: Aug. 31, 2015

(65) Prior Publication Data

US 2016/0064535 A1   Mar. 3, 2016

(30) Foreign Application Priority Data

Sep. 2, 2014  (EP) .................................... 14183296

(51) Int. Cl.

| | |
|---|---|
| *H01L 29/78* | (2006.01) |
| *H01L 29/94* | (2006.01) |
| *H01L 29/772* | (2006.01) |
| *H01L 29/775* | (2006.01) |
| *H01L 29/778* | (2006.01) |
| *H01L 29/66* | (2006.01) |
| *H01L 29/08* | (2006.01) |

(Continued)

(52) U.S. Cl.
CPC .... *H01L 29/66977* (2013.01); *H01L 29/0847* (2013.01); *H01L 29/1033* (2013.01); *H01L 29/205* (2013.01); *H01L 29/7391* (2013.01); *H01L 29/78* (2013.01); *H01L 29/66356* (2013.01)

(58) Field of Classification Search
CPC ............. H01L 29/0676; H01L 29/0847; H01L 29/1025; H01L 29/1033; H01L 29/165; H01L 29/205; H01L 29/267; H01L 29/36; H01L 29/66356; H01L 29/66431; H01L 29/66666; H01L 29/66977; H01L 29/7391; H01L 29/778; H01L 29/78; H01L 29/7827; H01L 29/785; H01L 29/78642; H01L 29/88; H01L 21/823885; H01L 2924/13062

See application file for complete search history.

(56) References Cited

U.S. PATENT DOCUMENTS

| | | |
|---|---|---|
| 8,258,031 B2 | 9/2012 | Lauer et al. |
| 8,421,165 B2 | 4/2013 | Loh et al. |

(Continued)

FOREIGN PATENT DOCUMENTS

| | | |
|---|---|---|
| EP | 1 900 681 A1 | 3/2008 |
| EP | 2 528 099 A1 | 11/2012 |

OTHER PUBLICATIONS

Delerue et al., "Concept of dielectric constant for nanosized systems", Physical Review B 68, 115411 2003.

(Continued)

*Primary Examiner* — Pamela E Perkins
(74) *Attorney, Agent, or Firm* — Knobbe Martens Olson & Bear, LLP

(57) ABSTRACT

A Tunnel Field-Effect Transistor (TFET) device is provided comprising at least one heterosection between the source region and the channel region. The at least one heterosection has a low dielectric constant and thickness below 10 nm. Additionally a pocket region and another heterosection may be added in between the at least one heterosection and the channel region.

13 Claims, 8 Drawing Sheets

(51) Int. Cl.
*H01L 29/10* (2006.01)
*H01L 29/205* (2006.01)
*H01L 29/739* (2006.01)

(56) References Cited

U.S. PATENT DOCUMENTS

| | | | |
|---|---|---|---|
| 8,431,924 B2 | 4/2013 | Iacopi et al. | |
| 8,436,422 B2 | 5/2013 | Loh et al. | |
| 2007/0148939 A1 | 6/2007 | Chu et al. | |
| 2008/0067495 A1* | 3/2008 | Verhulst | B82Y 10/00 257/12 |
| 2008/0067607 A1* | 3/2008 | Verhulst | B82Y 10/00 257/371 |
| 2008/0224224 A1* | 9/2008 | Vandenderghe | B82Y 10/00 257/365 |
| 2012/0153263 A1 | 6/2012 | Chu-Kung et al. | |
| 2012/0298959 A1* | 11/2012 | Verhulst | B82Y 10/00 257/27 |
| 2013/0105763 A1 | 5/2013 | Yin et al. | |

OTHER PUBLICATIONS

Goh et al., "Thickness effect on the band gap and optical properties of germanium thin films", Journal of Applied Physics 107, 024305 (2010); doi: 10.1063/1.3291103.

Palmer, D. W., www.semiconductors.co.uk, Feb. 2006, The Semiconductors-Information Web-Site, "Properties of III-V Semiconductors", Nov. 29, 2014.

Tian et al., "Effect of size on dielectric constant for low dimension materials", Physica B 406 (2011) 541-544.

Verhulst et al., "Complementary Silicon-Based Heterostructure Tunnel-FETs With High Tunnel Rates", IEEE Electron Device Letters, 29, 1398, 0741-3106/$25.00 © 2008 IEEE.

Yoo, H. G., "Dielectric constant reduction in silicon nanostructures", Physical Review B 77, 115355 2008.

Zhang et al., "Quantum Size Effects on Dielectric Constants and Optical Absorption of Ultrathin Silicon Films" IEEE Electron Device Letters, vol. 29, No. 12, Dec. 2008, pp. 1302-1305.

\* cited by examiner

HETEROSECTION TUNNEL FIELD-EFFECT TRANSISTOR (TFET)

INCORPORATION BY REFERENCE TO RELATED APPLICATION

Any and all priority claims identified in the Application Data Sheet, or any correction thereto, are hereby incorporated by reference under 37 CFR 1.57. This application claims the benefit of European Application No. EP 14183296.4 filed Sep. 2, 2014. The aforementioned application is incorporated by reference herein in its entirety, and is hereby expressly made a part of this specification.

FIELD OF THE INVENTION

Tunnel Field-Effect Transistors (TFETs) are provided wherein the tunneling effect is based on band-to-band tunneling. The tunnel field-effect transistors and associated methods are related to the fields of semiconductor devices and nanotechnology.

BACKGROUND OF THE INVENTION

Nanoelectronic devices are generally fabricated on semiconductor substrates as integrated circuits. A complementary metal-oxide-semiconductor (CMOS) field-effect transistor is one of the core elements of the integrated circuits. Dimensions and operating voltages of CMOS transistors are continuously reduced, or scaled down, to obtain ever-higher performance and packaging density of the integrated circuits.

One of the problems due to the scaling down of CMOS transistors is that the power consumption keeps increasing. This is partly because leakage currents are increasing (e.g., due to short channel effects) and because it becomes difficult to decrease the supply voltage. The latter is mainly due to the fact that the subthreshold swing is limited to minimally about 60 mV/decade, such that switching the transistor from ON to OFF needs a certain voltage variation and therefore a minimum supply voltage.

Tunnel field-effect transistors (TFETs) are typically advertised as successors of metal-oxide semiconductor field-effect transistors (MOSFETs), because of their absence of short-channel effects and because of their resulting low off-currents. Another advantage of TFETs is that the sub-threshold swing can be less than 60 mV/dec, the physical limit of conventional MOSFETs, such that potentially lower supply voltages can be used. However, all-silicon TFETs typically suffer from low on-currents, a drawback related to the large resistance of the tunnel barrier.

In the past there have been different attempts to improve TFET performance.

For example, Verhulst et al. propose in Electron Dev. Lett. 29, 1398 (2008) to use a heterostructure to boost the on-current. The heterostructure consists of using one semiconductor material in the source and another semiconductor material in the channel, such that the effective energetic distance between the source valence band and the channel conduction band (for n-TFET) has become smaller than the bandgap of the individual materials. This smaller effective bandgap allows for more efficient tunneling and hence higher on-currents.

SUMMARY OF THE INVENTION

There is still a need for further improved tunnel field-effect transistor (TFET) design.

Accordingly, a tunnel field-effect transistor is provided with improved performance, thereby increasing the on-current for a small supply voltage window (i.e. 0.6V or lower) and increasing the subthreshold swing.

The TFET is provided with good device properties, in particular, for example, a TFET with good $I_{DS}$-$V_{GS}$-characteristics is provided, meaning with a subthreshold swing less than 60 mV/dec.

In a first aspect, a tunnel field-effect transistor is provided comprising: a doped source region made of a source semiconductor material having a source doping type; a doped drain region made of a drain semiconductor material having a drain doping type opposite to the source doping type; a channel region made of lowly doped or undoped channel semiconductor material, the channel region situated between the source region and the drain region; at least one doped heterosection between the source region and the channel region with a heterosection doping type which is identical to the source doping type; the heterosection comprising a semiconductor material which is at least partially different from the semiconductor material of the neighboring regions with which the heterosection is in direct physical contact, the heterosection having a dielectric constant lower than 10, for instance lower than 6, and the heterosection having a thickness not larger than 10 nm. The thickness of the heterosection may be chosen such that a dielectric constant lower than 10, preferably lower than 6 is obtained for the low dielectric region.

It is an advantage of a TFET according to selected embodiments that a simplified manufacturing method for an enhanced TFET can be provided. By adding a thin slice of heterosection at the tunnel junction of the TFET device, the same beneficial impact on the electrostatic bending may be provided as an increase in doping, while avoiding the degeneracy penalty.

In selected embodiments, the semiconductor material of the heterosection may be completely different from the semiconductor material of the neighboring regions.

It is an advantage of selected embodiments of the TFET device that they offer improved performance, compared to prior art devices. The on-current (Ion) is increased and the subthreshold swing (SS) is decreased to values below 60 mV/decade. It is an advantage of selected embodiments that the dielectric constant is further decreased because then the phonon quantization is expected to be strongest (with slightly different, there is still a chance that phonon quantization is not complete).

In selected embodiments, the neighboring regions of the at least one heterosection may at least be the source region and additionally any of the channel region or a pocket region or another heterosection.

In selected embodiments, the semiconductor material of the at least one heterosection may have a dielectric constant which is at least 30% smaller than the dielectric constant of the bulk semiconductor material.

In selected embodiments, a simplified manufacturing method for an enhanced TFET is provided which does not need high doping but only providing a thin layer of semiconductor material.

In selected embodiments, the dielectric constant of the at least one heterosection may be smaller than $10\epsilon_0$.

In selected embodiments, the at least one heterosection may have a thickness of one monolayer.

In selected embodiments, the pocket region in between the at least one heterosection and the channel region may comprise a pocket semiconductor material which is different from the semiconductor material of the heterosection, and with a pocket doping type which is opposite to the source doping type.

It is an advantage of selected embodiments that the device properties of the TFET device are further improved compared to prior art by adding a pocket region. The on-current (Ion) is increased and the subthreshold swing (SS) is decreased to values below 60 mV/decade.

In selected embodiments, a tunnel field-effect transistor is provided wherein the another heterosection in between the at least one heterosection and the pocket region has a doping type which is opposite to the heterosection doping type.

In selected embodiments, the tunnel field-effect transistor may further comprise a gate stack, the gate stack being in direct contact with the channel region. The gate stack may be aligned with the channel region, or there may be an overlap or an underlap with the regions neighboring the channel region. The gate stack may be at least partly in contact with the at least one heterosection.

It is an advantage of selected embodiments that tunneling of the TFET device occurs rather parallel to the gate dielectric, referred to as point tunneling.

In selected embodiments, the tunnel field-effect transistor may comprise a gate stack in direct contact with the heterosection and with at least part of the channel region. The gate stack may additionally be at least partly in contact with the source region.

It is an advantage of selected embodiments that the tunneling mechanism of the TFET device is dominated by so-called line tunneling which occurs inside the source region in a direction substantially orthogonal/perpendicular to the gate region, referred to as line tunneling.

In selected embodiments, the heterosection may comprise a small bandgap material such as Si, Ge, In, As, Ga, Sb, Al, P or any combination thereof.

In selected embodiments, the heterosection may be doped with a dopant concentration in between 1018 at/cm3 to 1021 at/cm3.

In selected embodiments, the heterosection may comprise InP and the neighboring regions may comprise GaAsSb and InGaAs.

Selected aspects of the invention are set out in the accompanying independent and dependent claims. Features from the dependent claims may be combined with features of the independent claims and with features of other independent claims as appropriate and not merely as explicitly set out in the claims.

For purposes of summarizing the invention and the advantages achieved over the prior art, certain objects and advantages have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiments described hereinafter.

BRIEF DESCRIPTION OF THE DRAWINGS

The invention will now be described further, by way of example, with reference to the accompanying drawings. All figures are intended to illustrate some aspects and particular embodiments of the present invention. The figures are depicted in a simplified way for reason of clarity. Not all alternatives and options are shown and therefore the invention is not limited to the content of the given drawings. Like numerals are employed to reference like parts in the different figures.

DETAILED DESCRIPTION OF ILLUSTRATIVE EMBODIMENTS

Figure 1:
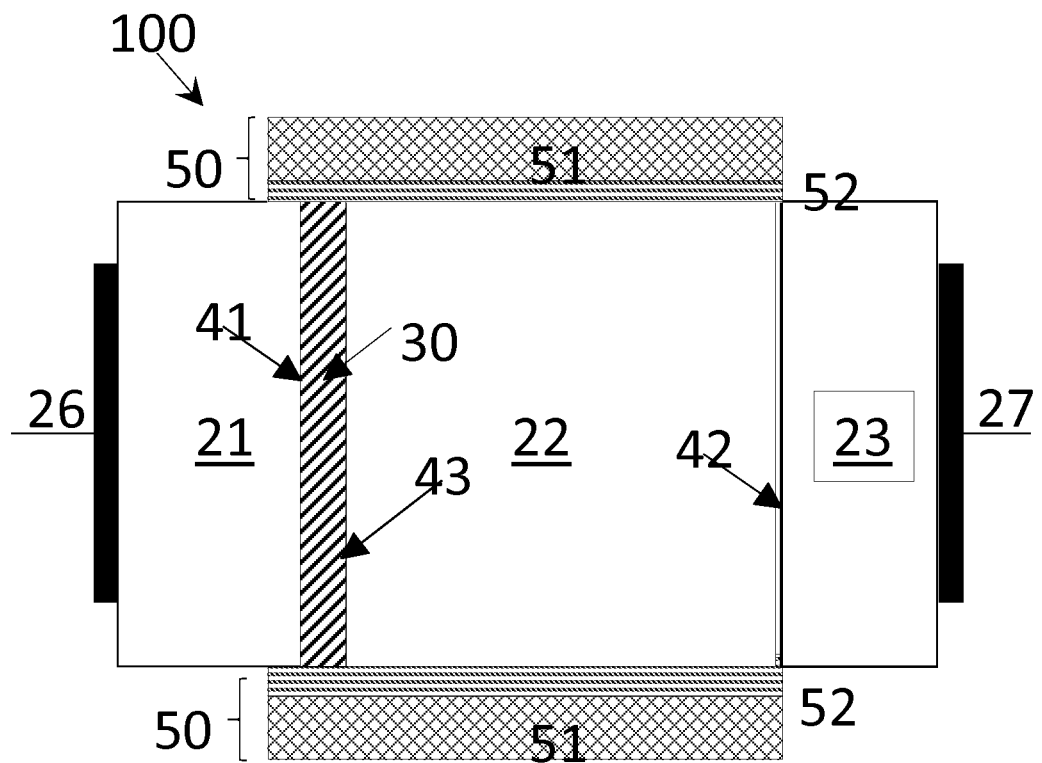
FIG. 1 illustrates a schematic representation of a cross-section of a TFET structure according to a selected embodiment.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The term top and the like in the description and the claims are used for descriptive purposes and not necessarily for describing relative positions. It is to be understood that the terms so used are interchangeable under appropriate circumstances and that the particular embodiments described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary particular embodiments, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that particular embodiments may be practiced without these specific details. In other instances, well-known methods, structures and techniques have not been shown in detail in order not to obscure an understanding of this description.

The invention will now be described by a detailed description of several particular embodiments. It is clear that other particular embodiments can be configured according to the knowledge of persons skilled in the art without departing from the technical teaching of the invention as defined by the appended claims.

When using the term "tunneling field-effect transistor (TFET)" herein, reference is made to a semiconductor device in which a gate controls a source-drain current through modulation of the so-called Band-To-Band Tunneling (BTBT). Band-to-band tunneling is a process in which electrons tunnel from the valence band through the semiconductor bandgap to the conduction band or vice versa.

Depending on the tunneling mechanism two types of TFETs may be distinguished: line TFET or point TFET. The tunneling mechanism of the line TFET device is dominated by so-called line tunneling which occurs inside the source region in a direction substantially orthogonal/perpendicular to the gate region, referred to as line tunneling. The tunneling mechanism of a point TFET device occurs partially inside the source region and partially inside the channel region in a direction substantially parallel to the gate region (45 degree or less), referred to as point tunneling.

When using the term "heterosection" herein, reference is made to a section of the TFET device consisting of a semiconductor material which is different from the semiconductor material of the neighboring (physically contacting) regions e.g. of the source and/or channel region. The difference may be a compositional difference such as for example differences in 'x' of $In_xGa_{1-x}As$, or the difference may be (preferably) fully different materials. Preferably, the material has the same position of valence and conduction band edge in vacuum, e.g. {InAlAs embedded in between 2 InP regions or vice versa} or {GaAs embedded in between 2 InP regions or vice versa}, such that the electrons/holes experience fairly unaltered band structure. Preferably, at least one of the 2 band edges (either valence band edge or conduction band edge) aligns with the valence band edge or conduction band edge of either the source material or the channel material. The heterosection is preferably a small bandgap material. The heterosection has the same doping type as the neighboring source. The doping can be equal, higher or lower than the doping in the remainder of the source, however it must remain highly doped, which is in a range of $10^{18}$ at/cm$^3$ to $10^{21}$ at/cm$^3$, preferably in a range between $10^{19}$ at/cm$^3$ and $5\times10^{20}$ at/cm$^3$.

When using the term "dielectric constant" herein, there is referred to the so-called "absolute dielectric constant" $\in$ (also often referred to as permittivity) which is measured in farads per meter (F/m). $\in = \in_r \times \in_0$ wherein $\in_r$ is the relative dielectric constant of a material and $\in_0$ is the vacuum dielectric constant; $\in_0 = 8.8541878176 \ldots \times 10^{-12}$ F/m.

While some embodiments described herein include examples of a double-gate TFET device, more specifically a TFET device comprising for example a source-channel-drain structure in the plane of a semiconductor substrate, e.g., a horizontal source-channel-drain structure, and a double gate electrode situated on the sidewalls of the channel region of the horizontal source-channel-drain structure, also other implementations of TFET devices may be applied in various embodiments, such as for example a tri-gate TFET, an all-round gate TFET, a nanowire TFET, or the like. A tri-gate TFET comprises a source-channel-drain structure in the plane of a semiconductor substrate, e.g. a horizontal source-channel-drain structure, and a triple gate electrode comprising three gate electrode parts situated respectively on the sidewalls and on top of the channel region of the horizontal source-channel-drain structure. A gate all-around TFET comprises a horizontal or a vertical source-channel-drain structure, i.e., a source-channel-drain structure in the plane of a substrate or substantially perpendicular to the plane of the substrate, and an all-around gate electrode situated around, i.e., surrounding or encircling, the channel region of the horizontal or vertical source-channel-drain structure. A nanowire TFET comprises a nanowire which forms at least the channel region, and optionally the channel region and one or more of the source and drain regions, and an all-around gate electrode structure around, i.e., surrounding or encircling, the channel region of the nanowire TFET.

While some embodiments described herein include examples of a nTFET (also often referred to as a p-i-n diode TFET), which means the semiconductor device comprises a p-type source (with a gate electrode at least partially contacting the source region, e.g. a gate electrode located on or around the source region) and a n-type drain, also other implementations of TFET devices may be applied such as for example a pTFET (also often referred to as n-i-p diode), which means the semiconductor device comprises an n-type source (with a gate electrode at least partially in contact with the source region, e.g., a gate electrode located on or around the source region) and a p-type drain. The source region of the TFET device is the current injection side.

FIG. 1 shows a point TFET device 100 according to an embodiment. The point TFET comprises a source region 21, a channel region 22 and a drain region 23. The source region 21 is doped and comprises a source semiconductor material having a first doping type and a first doping concentration.

The doped source region is preferably highly doped with a doping level of $10^{18}$ cm$^{-3}$ or higher, The drain region 23 is doped and comprises a drain semiconductor material having a second doping type which is opposite to the source doping type and has a second doping concentration of $10^{17}$ cm$^{-3}$ or higher. The channel region 22 is located in between the source 21 and drain region 23 and is undoped or lowly or intrinsically doped, i.e. with a doping concentration below $10^{17}$ cm$^{-3}$ or lower. The channel region 22 and the drain region 23 have a channel-drain interface 42 in common. In between the source region 21 and the channel region 22 there is a heterosection 30. The heterosection 30 and source region 21 have a source-heterosection interface 41 in common. The heterosection 30 and the channel region 21 may have a heterosection-channel interface 43. A gate electrode 51 and gate dielectric 52 (together forming the gate stack 50) are present at both sides of the layers. At the drain side, the gate stack 50 may overlap or underlap the channel-drain interface 42. The gate stack 50 may also be perfectly aligned to the channel-drain interface 42. At the source side, the gate stack 50 may overlap with the channel-heterosection interface 43, or even with both the channel-heterosection interface 43 and the source-heterosection interface 41. An overlap of about 5 nm beyond the heterosection-channel interface 43 is typical which means the heterosection 30 is overlapped fully as the heterosection typically has a thickness smaller than 5 nm. The gate stack 50 may also perfectly align to the heterosection-channel interface.

For a point N-TFET, the TFET as in FIG. 1 may be referred to as a p-p$_h$-i-n TFET wherein p$_h$ refers to the heterosection. For a point P-TFET, the TFET as in FIG. 1 may be referred to as a n-n$_h$-i-p TFET wherein n$_h$ refers to the heterosection.

Figure 2:
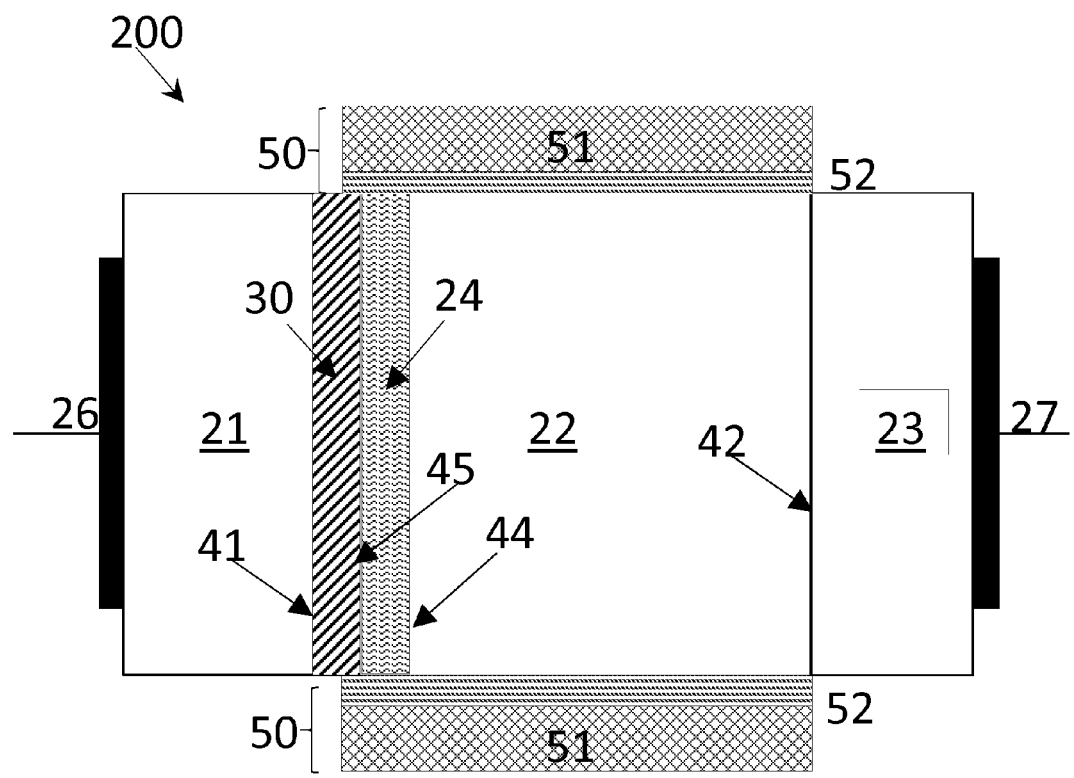
FIG. 2 illustrates a schematic representation of a cross-section of a TFET structure according to a selected embodiment.

FIG. 2 shows a point TFET device 200 as shown in FIG. 1 with the only difference that a pocket region 24 is inserted between the heterosection 30 and the channel region 22. Thereby a heterosection-pocket interface 45 and a pocket-channel interface 44 are present. At the source side, the gate stack 50 may overlap with the pocket-channel interface 44, or may even overlap with both the pocket-channel interface 44 and the heterosection-pocket interface 45, or with all of the pocket-channel interface 44, the heterosection-pocket interface 45 and the source-heterosection interface 41. The gate stack 50 may also perfectly align to the pocket-channel interface 44. The pocket region 24 may be intrinsically doped or doped with a dopant concentration in the range of 1E$^{18}$ at/cm$^3$ or higher. However, the doping type of the pocket region 24 should be opposite to the doping type of the source region 21 and heterosection 30. The pocket region 24 may comprise the same material as the channel region.

Figure 6:
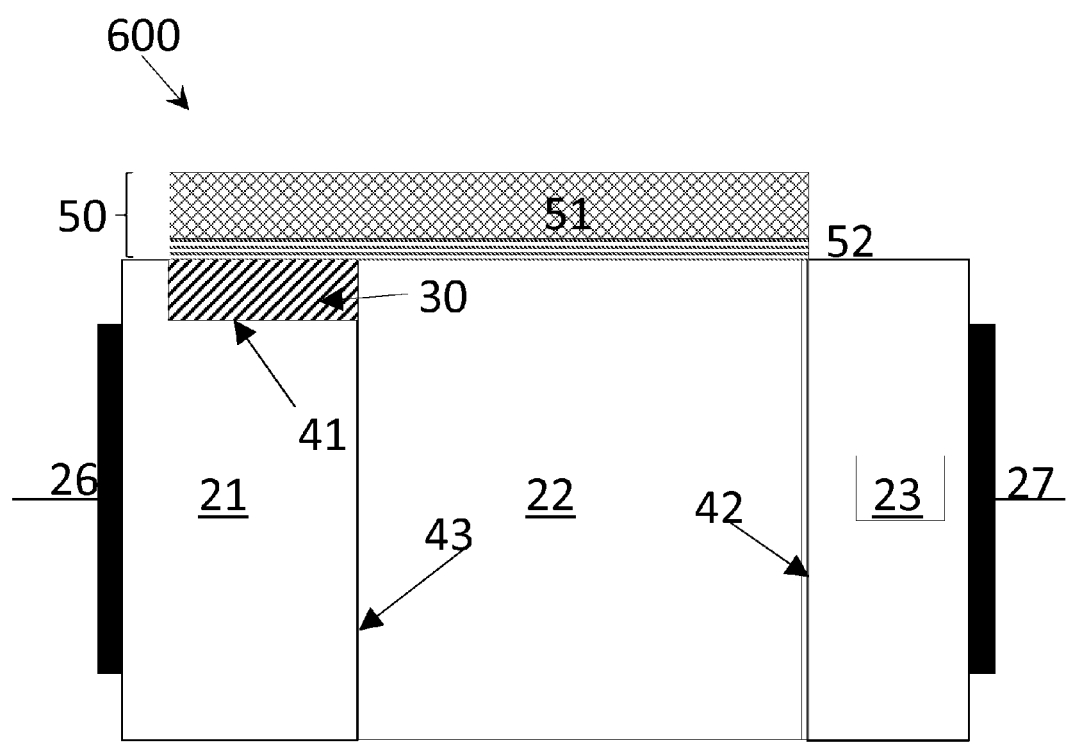
FIG. 6 illustrates a schematic representation of a cross-section of a TFET structure according to a selected embodiment.

FIG. 6 shows a line TFET device 600 wherein source 21, drain 23 and channel 22 region are identical to the ones of a point TFET, but wherein the heterosection 30 is located in between the source region 21 and gate dielectric 52 of the gate stack 50. The source-heterosection interface 41 (being defined by the longest side contacting both source region and heterosection) lies thus in this case (substantially) parallel to the gate dielectric 52. The gate stack 50 should have a large gate overlap with the source region 21 (more than or equal to 5 nm, preferably more than 10 nm), more specifically the heterosection 30 should be preferably as long as the part of the gate stack 50 covering the source region 21, or otherwise said, the gate stack 50 and the heterosection 30 are preferably aligned at the source side.

Figure 7:
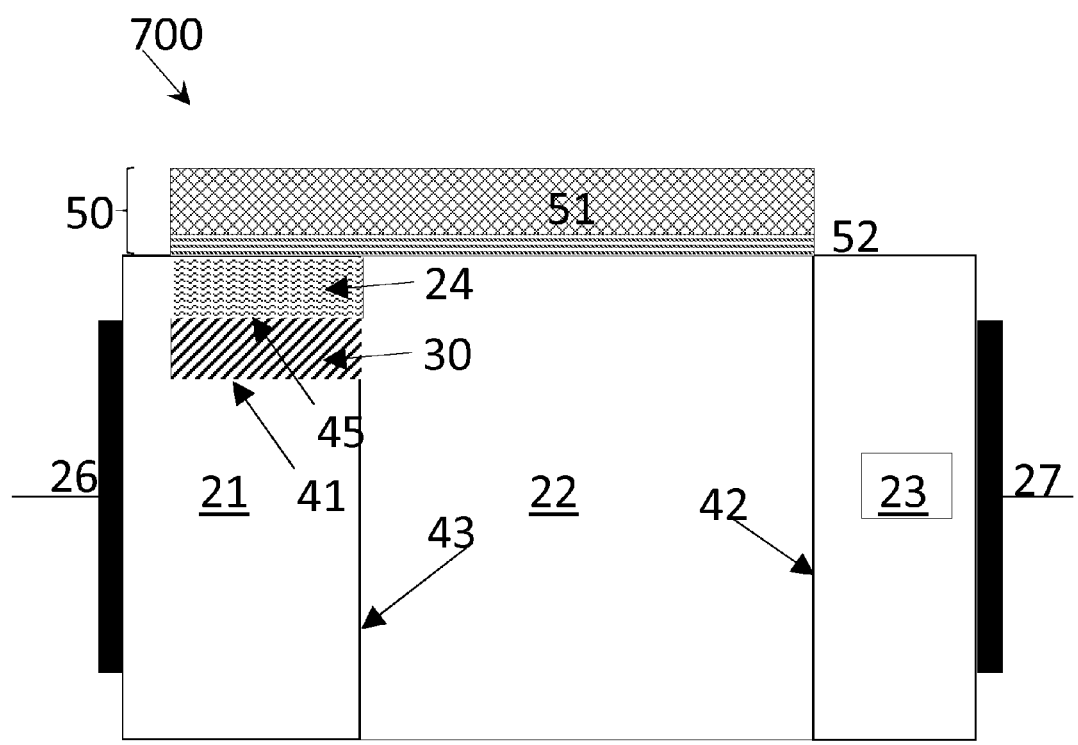
FIG. 7 illustrates a schematic representation of a cross-section of a TFET structure according to a selected embodiment.

FIG. 7 shows a line TFET device 700 as in FIG. 6 wherein a pocket region 24 is further inserted in between the heterosection 30 and the gate stack 50. Again a source-heterosection interface 41 (being defined by the longest side contacting both source region 21 and heterosection 30) and a heterosection-pocket interface 45 may be defined which in this case lie (substantially) parallel to the gate dielectric 52. The properties of the pocket region 24 are the same as described above with respect to FIG. 2 for a point TFET. The gate stack 50 should have a large gate overlap with the source region 21 (more than or equal to 5 nm, preferably more than 10 nm), more specifically the heterosection 30 should be preferably as long as the part of the gate stack 50 covering the source region 21, or otherwise said, the gate stack 50 and the heterosection 30 are preferably aligned at the source side.

For a N-TFET, the TFET as in FIG. 1 and FIG. 6 may be referred to as a p-p$_h$-i-n TFET. For a P-TFET, the TFET as in FIG. 1 and FIG. 6 may be referred to as a n-n$_h$-i-p TFET. Both p$_h$ and n$_h$ refer to the heterosection.

For a N-TFET, the TFET as in FIG. 2 and FIG. 7 may be referred to as a p-p$_h$-n-i-n TFET. For a P-TFET, the TFET as in FIG. 2 and FIG. 7 may be referred to as a n-n$_h$-p-i-p TFET. Both p$_h$ and n$_h$ refer to the heterosection.

The heterosection 30 has a thickness of about one monolayer, which is smaller than 10 nm, more preferably smaller than 5 nm and even more preferably smaller than 3 nm. The thickness of the heterosection 30 should be chosen such that the dielectric constant of the heterosection is decreased significantly as compared to its value for a larger thickness. It is assumed that the dielectric constant $\in_r$ decreases with size confinement. The underlying physical principle is based on the quantization of phonons. A change in the available phonons affects the electronic, the ionic and the dipolar part of the polarization vector, and hence affects the dielectric constant. By inserting in between the first region, e.g. source region 21, and the channel region 22 a heterosection 30 according to selected embodiments, the dielectric constant $\in_r$ is decreased significantly in the region of the TFET device with the strongest band bending during operation of the device. The strongest band bending implies the shortest tunnel distance and hence the highest tunnel current.

A bulk semiconductor typically has a relative dielectric constant $\in_r$ higher than 10, typically between 12 and 16 (for example $\in_{r,Si}$=12, $\in_{r,InP}$=14). By decreasing the thickness of the heterosection 30, the dielectric constant may be decreased at least by 30% compared to its value of the bulk semiconductor, i.e., having a thickness larger than 10 nm.

Figure 5:
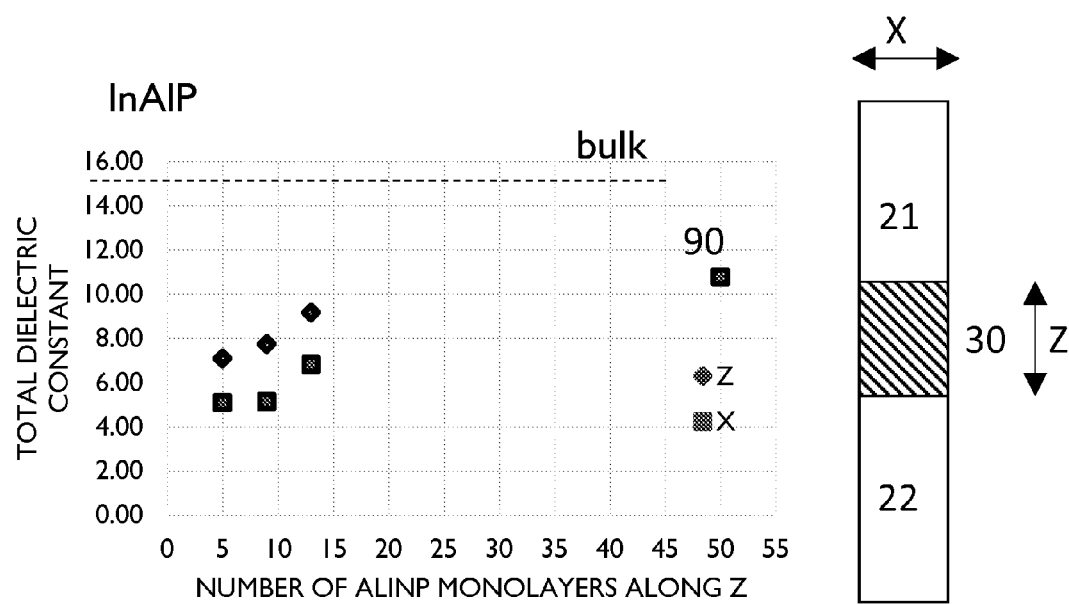
FIG. 5 shows experimental results for the dielectric constant of a TFET structure according to a selected embodiment.

FIG. 5 shows the periodic direction X and direction of quantization Z for different dielectric constant values in function of the amount of AlInP monolayers of a heterosection 30 in between a source region 21 and channel region 22. Dot 90 shows the value for AlInP bulk material whereas it is seen that the dielectric constant decreases with decreasing thickness (less monolayers).

From simulations the beneficial effects of a TFET device according to selected embodiments are shown.

Figure 3A:
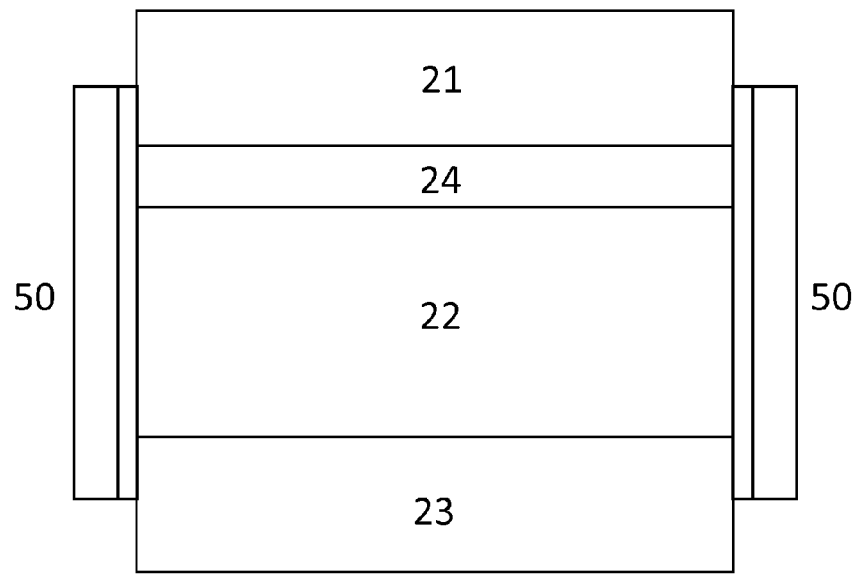
FIG. 3A illustrates a particular configuration of a TFET according to a selected embodiment and FIG. 3B show experimental results for device characteristics of the TFET structure of FIG. 3A.

The configuration according to an embodiment has been simulated with an all-InGaAs p-n-i-n configuration as illustrated in FIG. 3A. This configuration is representative for a structure whereby the heterosection has a similar bandgap and electron affinity as the source and channel material, for example, InP—InAlAs. It isolates the impact of the dielectric constant.

Figure 3B:
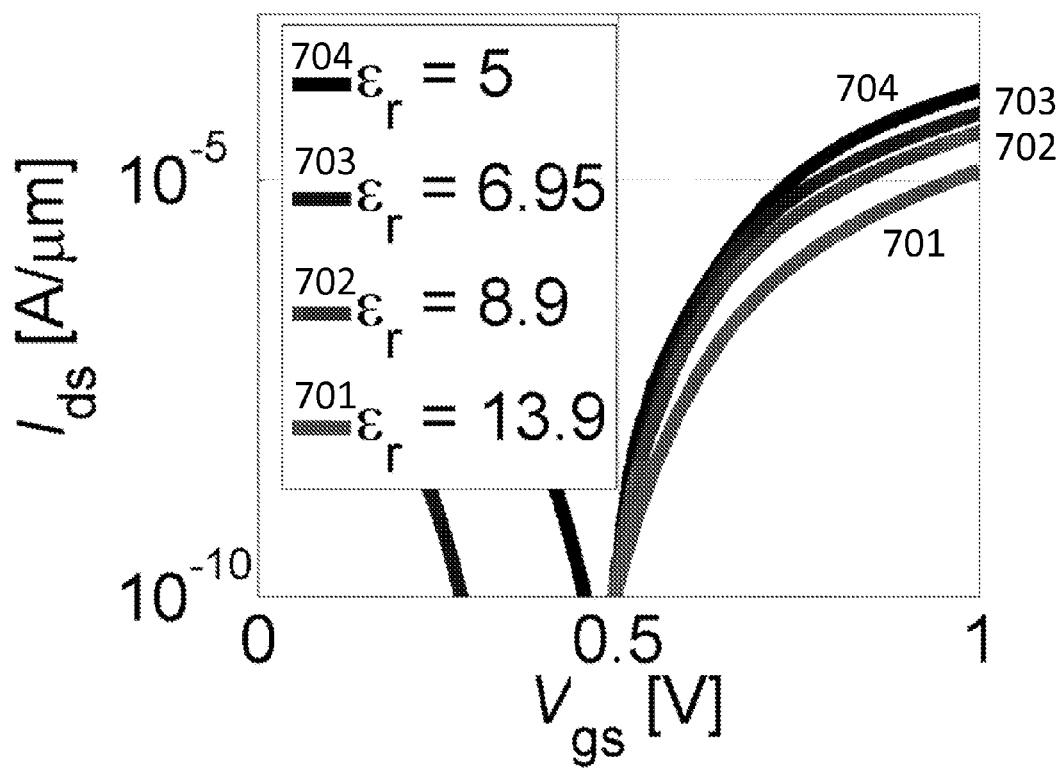

With the simulation results shown in FIG. 3B the global impact of the relative dielectric constant $\in r$ on the device properties is shown. The on-current Ion (FIG. 3B) has been calculated for a supply voltage $V_{dd}$ of 0.5V for a In$_{0.53}$Ga$_{0.47}$As p-n-i-n TFET (FIG. 3A). The In$_{0.53}$Ga$_{0.47}$As p-n-i-n TFET comprises a source region 21 of 30 nm p-InGaAs with a doping concentration of $5 \times 10^{19}$ at/cm$^3$, a pocket region 24 of 2 nm n-InGaAs with a doping concentration of $5 \times 10^{19}$ at/cm$^3$, a channel region 22 of 50 nm i-InGaAs with a doping concentration of $1 \times 10^{10}$ at/cm$^3$ and a drain region 23 of 30 nm n-InGaAs with a doping concentration of $1 \times 10^{18}$ at/cm$^3$. A gate stack 50 is provided at the side of the layers. Simulations have been done for four different configurations. Line 701 shows the results for which the TFET device of FIG. 3A is completely made of InGaAs with a relative dielectric constant ∈r of 13.9. Line 702 shows the results for which the TFET device of FIG. 3A is completely made of InGaAs with an artificial decrease of the relative dielectric constant ∈r to 8.9. Line 703 shows the results for which the TFET device (of FIG. 3A) is completely made of InGaAs comprising the pocket region as described above with an artificial decrease of the relative dielectric constant ∈r to 6.95. Line 704 shows the results for which the TFET device of FIG. 3A is completely made of InGaAs with a further artificial decrease of the relative dielectric constant ∈r to 5. By decreasing the relative dielectric constant ∈r with a factor 1.5, the on-current Ion becomes four times higher compared to the on-current Ion for a prior art TFET device bulk semiconductor with relative dielectric constant ∈r of 13.9. By decreasing the relative dielectric constant ∈r with a factor 2, the on-current Ion becomes 6 times higher. By decreasing the relative dielectric constant ∈r with a factor 3, the on-current Ion becomes 10 times higher.

An increase in on-current with nearly a factor 10 is observed in a supply voltage window of 0.5V (off at Vgs=0.5V, on at Vgs=1V), and a steepening of the subthreshold swing, indicating the beneficial impact of the pocket 24. This can be seen by shifting all curves to the same Vgs-Ioff point at 0.5V-100 pA/μm. Line 704 with a full configuration in low-dielectric constant material, illustrates that the use of multiple heterosections would also be beneficial as further improvement is seen.

Figure 4A:
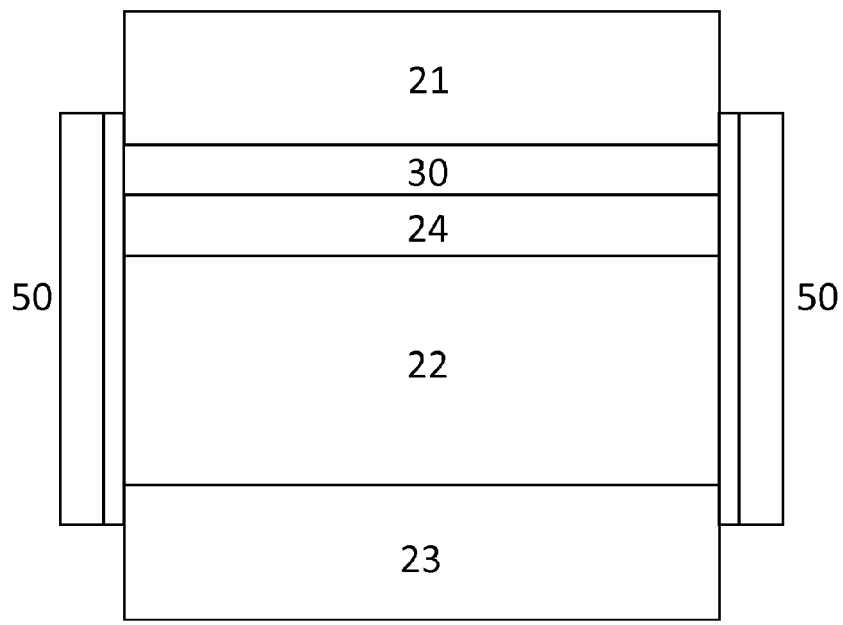
FIG. 4A illustrates a particular configuration of a TFET according to a selected embodiment and FIG. 4B shows experimental results for device characteristics of the TFET structure of FIG. 4A.
Figure 4B:
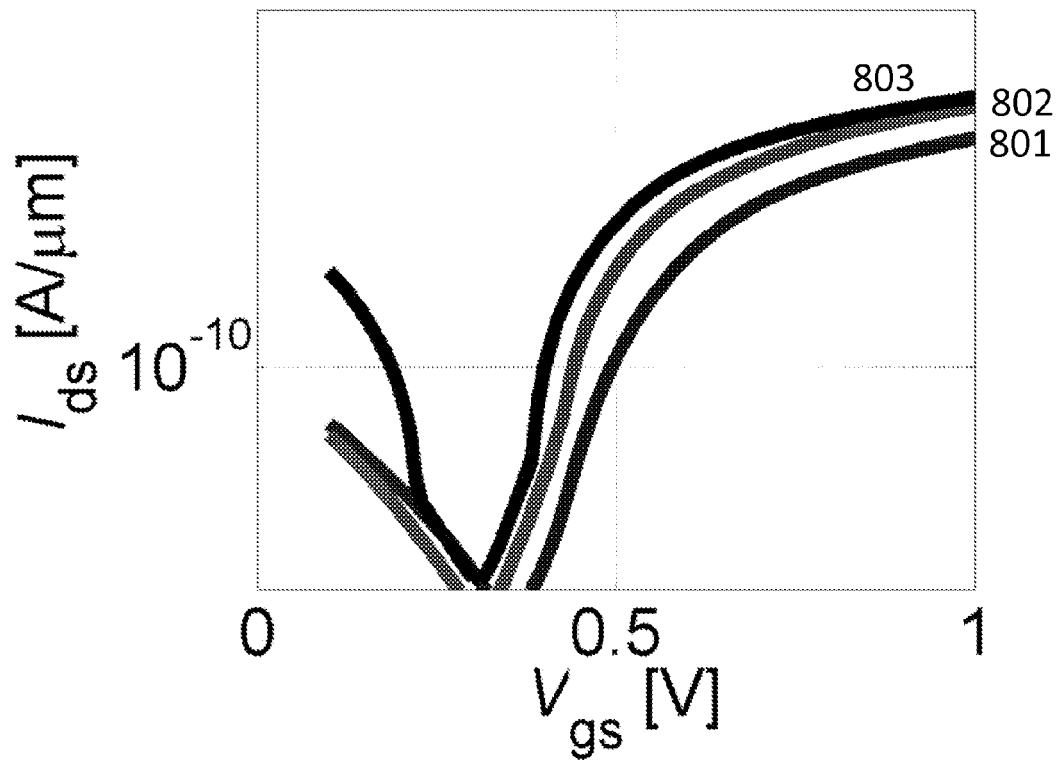

With the simulation results shown in FIG. 4B the impact of the relative dielectric constant $\in_r$ of a thin heterosection 30 on the device properties is shown wherein a heterosection is added to the TFET device (FIG. 4A) as described with respect to FIG. 3A. A heterosection 30 of 2 nm of p-InGaAs is added in between the source region 21 and the channel region 22. The relative dielectric constant of the heterosection 30 is about 7, which is about half the value of the bulk material. FIG. 4B shows the increase in on-current $I_{on}$ with nearly one order of magnitude for a supply voltage $V_{dd}$ of 0.5V. Line 801 shows the results for which the TFET device is completely made of InGaAs with a relative dielectric constant $\in_r$ of 13.9. Line 803 shows the results for which the TFET device with a pocket region is completely made of InGaAs with an artificial decrease of the relative dielectric constant $\in_r$ to 6.95. Line 802 shows the results for which the TFET device is completely made of InGaAs with relative dielectric constant $\in_r$ of 13.9 comprising the pocket region (also $\in_r$=13.9) and whereby the heterosection as described above is also InGaAs but with an artificial decrease of the relative dielectric constant $\in_r$ to 6.95.

Figure 8:
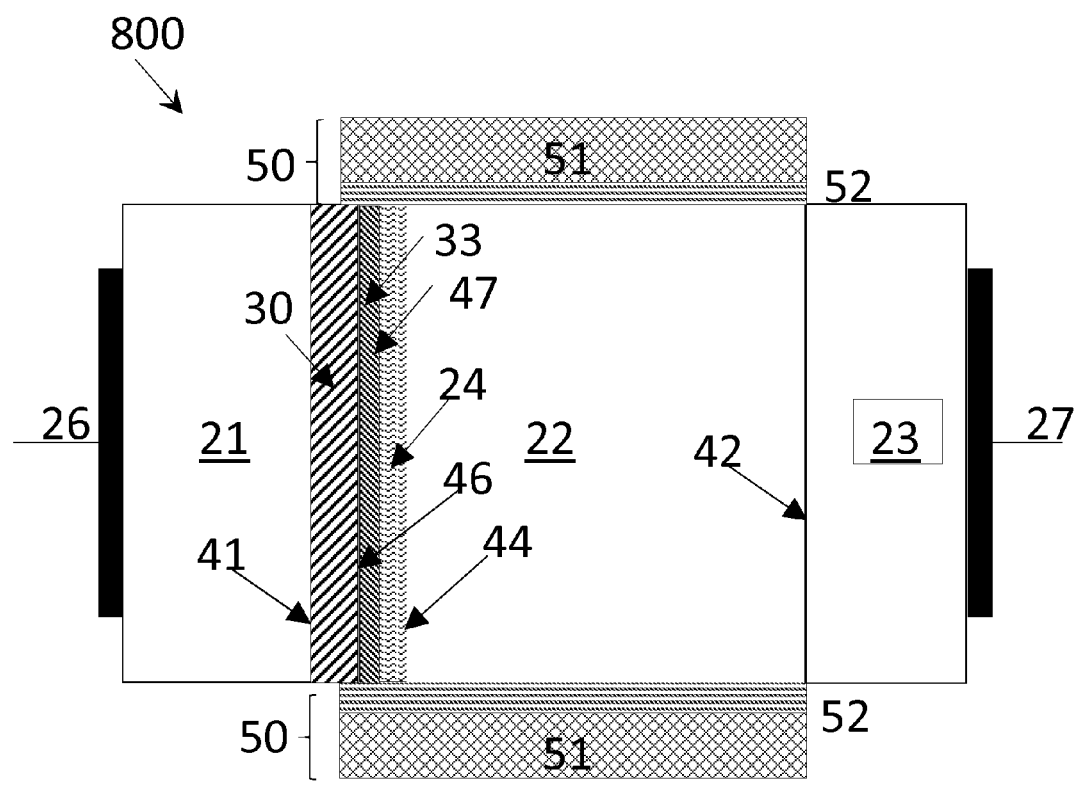
FIG. 8 illustrates a schematic representation of a cross-section of a TFET structure according to a selected embodiment.

In FIG. 8 an example of a TFET 800 according to an embodiment. A configuration with two heterosections 30, 33 is shown. Depending on the chosen doping types it may thus be a p-p$_h$-n$_h$-n-i-n configuration or n-n$_h$-p$_h$-n-i-n configuration. A first heterosection 30 is present at the source region side 21 and a second heterosection 33 is present at the pocket region side 24. The TFET 800 further comprises a channel region 22, a drain region 23 and gate stacks 50 at both sides. Both heterosections 30, 33 must have a different material composition as they are neighboring regions. Four interfaces may be defined, a source/heterosection interface 41, a heterosection/heterosection interface 46, a heterosection/pocket interface 47 and a pocket/channel interface 44.

The TFET device according to selected embodiments is beneficial for all applications where band bending is desirable and which can benefit from a strongly reduced dielectric constant ∈.

For TFET devices according to selected embodiments, there are no restrictions for the material of the source region 21 and the channel region 22. The material of the source region 21 and the channel region 22 may thus be the same, but may also be different. The important criterion for the material choice of the source region 21 and the channel region 22 is that they must be different from the heterosection 30.

For TFET devices according to selected embodiment, there are no restrictions for the material of the drain region 23. The material of the drain region 23, the channel region 22 and/or the source region 21 may thus be the same, but may also be different.

The at least one heterosection 30 with low dielectric constant must be placed in the tunneling region of the TFET device. Otherwise said, as many regions as possible should have a low dielectric constant. This may be done, according to selected embodiment, by several options: adding a heterosection 30 at the source region 21 side, adding a heterosection 30 at the pocket region 24 side or adding a first heterosection 30 at the source 21 region side and adding a second heterosection 33 at the pocket region 24 side.

While the disclosure has been illustrated and described in detail in the drawings and foregoing description, such illustration and description are to be considered illustrative or exemplary and not restrictive. The disclosure is not limited to the disclosed embodiments. Variations to the disclosed embodiments can be understood and effected by those skilled in the art in practicing the claimed disclosure, from a study of the drawings, the disclosure and the appended claims.

All references cited herein are incorporated herein by reference in their entirety. To the extent publications and patents or patent applications incorporated by reference contradict the disclosure contained in the specification, the specification is intended to supersede and/or take precedence over any such contradictory material.

Unless otherwise defined, all terms (including technical and scientific terms) are to be given their ordinary and customary meaning to a person of ordinary skill in the art, and are not to be limited to a special or customized meaning unless expressly so defined herein. It should be noted that the use of particular terminology when describing certain features or aspects of the disclosure should not be taken to imply that the terminology is being re-defined herein to be restricted to include any specific characteristics of the features or aspects of the disclosure with which that terminology is associated. Terms and phrases used in this application, and variations thereof, especially in the appended claims, unless otherwise expressly stated, should be construed as open ended as opposed to limiting. As examples of the foregoing, the term 'including' should be read to mean 'including, without limitation,' 'including but not limited to,' or the like; the term 'comprising' as used herein is synonymous with 'including,' 'containing,' or 'characterized by,' and is inclusive or open-ended and does not exclude additional, unrecited elements or method steps; the term 'having' should be interpreted as 'having at least;' the term 'includes' should be interpreted as 'includes but is not limited to;' the term 'example' is used to provide exemplary instances of the item in discussion, not an exhaustive or limiting list thereof; adjectives such as 'known', 'normal', 'standard', and terms of similar meaning should not be construed as limiting the item described to a given time period or to an item available as of a given time, but instead should be read to encompass known, normal, or standard technologies that may be available or known now or at any time in the future; and use of terms like 'preferably,' 'preferred,' 'desired,' or 'desirable,' and words of similar meaning should not be understood as implying that certain features are critical, essential, or even important to the structure or function of the invention, but instead as merely intended to highlight alternative or additional features that may or may not be utilized in a particular embodiment of the invention. Likewise, a group of items linked with the conjunction 'and' should not be read as requiring that each and every one of those items be present in the grouping, but rather should be read as 'and/or' unless expressly stated otherwise. Similarly, a group of items linked with the conjunction 'or' should not be read as requiring mutual exclusivity among that group, but rather should be read as 'and/or' unless expressly stated otherwise.

Where a range of values is provided, it is understood that the upper and lower limit, and each intervening value between the upper and lower limit of the range is encompassed within the embodiments.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. The indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All numbers expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

Furthermore, although the foregoing has been described in some detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention.

What is claimed is:

1. A tunnel field-effect transistor, comprising:
a doped source region comprising a source semiconductor material having a source doping type;
a doped drain region comprising a drain semiconductor material having a drain doping type opposite to the source doping type;
a channel region comprising a lowly doped channel semiconductor material or an undoped channel semiconductor material, the channel region situated between the doped source region and the doped drain region;
at least one doped heterosection between the doped source region and the channel region, the at least one doped heterosection having a heterosection doping type which is identical to the source doping type, the at least one doped heterosection comprising a semiconductor material which is at least partially different from semiconductor materials of neighboring regions with which the at least one doped heterosection is in direct physical contact, the at least one doped heterosection having a dielectric constant lower than 10, and the at least one doped heterosection having a thickness not larger than 10 nm, wherein the neighboring regions of the at least one doped heterosection comprise at least the doped source region and at least one region selected from the group consisting of the channel region, a pocket region, and another doped heterosection, and wherein the pocket region in between the at least one doped heterosection and the channel region comprises a pocket semiconductor material which is different from the semiconductor material of the at least one doped heterosection and with a pocket doping type which is opposite to the source doping type.

2. The tunnel field-effect transistor of claim 1, wherein the semiconductor material of the doped heterosection is completely different from the semiconductor material of the neighboring regions.

3. The tunnel field-effect transistor of claim 1, wherein the semiconductor material of the at least one doped heterosection has a dielectric constant which is at least 30% smaller than a dielectric constant of a bulk semiconductor material.

4. The tunnel field-effect transistor of claim 1, wherein a dielectric constant of the at least one doped heterosection is smaller than $10\epsilon_0$.

5. The tunnel field-effect transistor of claim 1, wherein the at least one doped heterosection has a thickness of one monolayer.

6. The tunnel field-effect transistor of claim 1, wherein the another doped heterosection in between the at least one doped heterosection and the pocket region has a doping type which is opposite to the heterosection doping type.

7. The tunnel field-effect transistor of claim 1, further comprising a gate stack in direct contact with the channel region.

8. The tunnel field-effect transistor of claim 7, wherein the gate stack is at least partly in contact with the at least one doped heterosection.

9. The tunnel field-effect transistor of claim 1, further comprising a gate stack, the gate stack being in direct contact with the at least one doped heterosection and with a part of the channel region.

10. The tunnel field-effect transistor of claim 9, wherein the gate stack is at least partly in contact with the doped source region.

11. The tunnel field-effect transistor of claim 1, wherein the heterosection comprises a small bandgap material selected from the group consisting of Si, Ge, In, As, Ga, Sb, Al, P, and combinations thereof.

12. The tunnel field-effect transistor of claim 1, wherein the heterosection is doped with a dopant concentration of from $10^{18}$ at/cm$^3$ to $10^{21}$ at/cm$^3$.

13. The tunnel field-effect transistor of claim 1, wherein the heterosection comprises InP and the neighboring regions comprise GaAsSb and InGaAs.

* * * * *